United States Patent [19]

Flynn et al.

[11] Patent Number: 5,034,334
[45] Date of Patent: Jul. 23, 1991

[54] METHOD OF PRODUCING A SEMICONDUCTOR LASER ADAPTED FOR USE IN AN ANALOG OPTICAL COMMUNICATIONS SYSTEM

[75] Inventors: Edward J. Flynn, Summit, N.J.; Carl J. McGrath, Atkinson, N.H.; Paul M. Nitzsche, Plainfield; Charles B. Roxlo, Bridgewater, both of N.J.

[73] Assignee: AT&T Bell Laboratories, Murray Hill, N.J.

[21] Appl. No.: 420,867

[22] Filed: Oct. 13, 1989

[51] Int. Cl.$^5$ ............... H01L 21/66; H01L 21/20
[52] U.S. Cl. ............... 437/8; 148/DIG. 95; 148/DIG. 162; 437/129; 437/133
[58] Field of Search ............... 148/DIG. 57, 65, 72, 148/95, 97, 99, 162; 250/213 A, 227, 14; 357/16, 17; 356/446, 349; 372/43, 44, 50, 96; 350/96.29, 96.16; 437/8, 81, 105, 107, 126, 127, 129, 133, 905

[56] References Cited

U.S. PATENT DOCUMENTS

| | | | |
|---|---|---|---|
| 4,372,791 | 2/1983 | Hsieh | 437/129 |
| 4,451,146 | 5/1984 | Grage et al. | 356/446 |
| 4,489,477 | 12/1984 | Chik et al. | 437/8 |
| 4,540,451 | 9/1985 | Leibenzeder et al. | 437/8 |
| 4,560,246 | 12/1985 | Cotter | 350/96.16 |
| 4,573,255 | 3/1986 | Gordon et al. | 437/8 |
| 4,680,810 | 7/1987 | Swartz | 455/609 |
| 4,714,826 | 12/1987 | Goutzoulis | 250/213 A |
| 4,777,146 | 10/1988 | Bylsma et al. | 437/8 |
| 4,820,047 | 4/1989 | Snyder | 356/349 |

FOREIGN PATENT DOCUMENTS 0066424  3/1987  Japan.
0202711  8/1988  Japan.

OTHER PUBLICATIONS

"60-Channel FM Video Subcarrier Multiplexed Optical Communication System", by R. Olshansky et al., Electronics Letters, vol. 23, No. 22, Oct. 22, 1987, pp. 1196–1197.

"Growth and Characterization of High Yield, Reliable, High-Power, High-Speed, InP/InGaAsP Capped Mesa Buried Heterostructure Distributed Feedback (CMBH-DFB) Lasers", by J. L. Zilko et al., IEEE Journal of Quantum Electronics, vol. 25, No. 10, Oct. 1989, pp. 2091–2095.

Primary Examiner—Olik Chaudhuri
Assistant Examiner—William Bunch
Attorney, Agent, or Firm—Eugene E. Pacher

[57] ABSTRACT

An advantageous method of fabricating lasers adapted for use in a multichannel analog optical fiber communication system, e.g., a CATV system, is disclosed. A laser generally can be used in such a communication system only if it meets, inter alia, very stringent intermodulation specifications. To identify such lasers typically requires extensive testing. It has now been discovered that certain readily determinable parameters can be used to predict the intermodulation behavior of a given device. This discovery makes possible a simpler, and therefore less costly, process of identifying suitable lasers, resulting in a more economical method of making lasers for the stated application. The method comprises measuring the light versus current (L versus I) characteristic of a given laser, determining therefrom the first, second, and possibly higher, order derivatives of L with respect to I, and determining therefrom a parameter that is a predictor of the distortion behavior of the laser. Exemplarily, the quantity is the normalized second order distortion (2HD/C), defined as 20 log (mL"/4L'$^2$), where m is the modulation index, and L' and L" are the first and second derivatives, respectively, of L. 2HD/C has a pronounced minimum at I=I$_{op}$, the current at which L"=0. Advantageously, lasers are selected that have 2HD/C less than a predetermined value (e.g., −70 dbc, with m=0.04) over a relatively wide current range (e.g., at least 4 mA).

6 Claims, 2 Drawing Sheets

METHOD OF PRODUCING A SEMICONDUCTOR LASER ADAPTED FOR USE IN AN ANALOG OPTICAL COMMUNICATIONS SYSTEM

FIELD OF THE INVENTION

This invention pertains to optical multichannel analog communications systems. In particular, it pertains to methods of making lasers adapted for use in such a system.

RELATED APPLICATIONS

The following application is related to this application, is being concurrently filed with this, and is incorporated herein by reference: U.S. patent application Ser. No. 07/420,849, titled "An Optical Subcarrier Multiplex Television System Using a Low Leakage Current Laser Diode", G. E. Bodeep et al.

BACKGROUND OF THE INVENTION

The concept of transmitting several television channels through optical fiber using analog intensity modulation of the output of a semiconductor laser diode has recently been receiving considerable attention. As proposed in the prior art, this would involve transmission of multi-channel amplitude modulated-vestigial side band (AM-VSB) signals, as used in present day cable television (CATV) systems, in an optical fiber transmission medium. Such an arrangement would be useful in a CATV trunk system or in a fiber-to-the-home network. Optical fiber transmission systems that use frequency division multiplexing overcome compatibility problems and have advantages such as simplicity of design, reduced bandwidth requirements for lightwave components, and much lower costs, as compared with optical time division multiplex (TDM) systems.

The wide bandwidths of semiconductor laser diodes and optical fibers make analog sub-carrier modulation an attractive technology. Several signals at different sub-carrier frequencies, each signal representing one of the television channels to be multiplexed, are summed and applied concurrently to the input of the laser device. The input information signal is a set of frequency-modulated sub-carriers at different frequencies, e.g., frequencies $\omega_0, \omega_1, \omega_2, \ldots$. The resulting laser injection current comprises a dc bias level plus the set of frequency-modulated sub-carrier signals. The magnitude of the optical output power from the laser fluctuates with the magnitude of the laser injection current. The resulting sub-carrier frequency division multiplexed (FDM) optical output signal is applied to an optical fiber for transmission over an extended distance. After transmission through the fiber the optical signal is detected by appropriate means, e.g., a PIN diode, and the resulting electrical signal is processed by conventional means to recover the individual signals. See, for instance, R. Olshansky et al., *Electronics Letters*, Vol. 23(22), pp. 1196–1197.

Multi-channel amplitude modulated signal transmission requires special limitations on the power, the non-linearity, and the intensity noise of the transmitting laser diode. For adequate system performance, laser output light intensity must be a very nearly linear function of the laser drive current under large-signal modulation. Strict limitations on laser nonlinearity are required because of the wide dynamic range of the National Television Systems Committee (NTSC) standard video format. Exemplarily, in the NTSC standard video format, the ratio of the magnitude of the carrier to the magnitude of the total third order intermodulation distortion products at the carrier frequency must be less than −60 dBc. Similarly, the peak second-order distortion, i.e., the sum of several tens of two-tone products (or the ratio of the carrier to the largest composite second-order peak), must be less than −60 dBc. To obtain such high signal quality in view of the large number of distortion products, the transmitting laser light-versus-current characteristic must be extremely linear.

In a system that uses frequency division multiplexing any nonlinearity in the laser diode characteristic will result in intermodulation noise. Laser nonlinearities create energy transfers from the applied sub-carrier frequencies to, among others, those frequencies that are the sum and difference frequencies of all of the pairs of applied signal frequencies. Such energy transfers cause undesirable intermodulation distortion and interference, both of which can limit the performance of the transmission system.

There are several known causes of nonlinearity in semiconductor laser diodes. Some of the causes of nonlinearity are high frequency relaxation oscillations, low frequency heating effects, damping mechanisms, optical modulation depth, leakage current, gain compression, and nonlinear absorption. The resulting effect of the distortion and interference is a degradation in the signal-to-noise ratio for the signal, as received further along in the system.

An experimental sub-carrier frequency division multiplexed, optical communication system having sixty frequency-modulated channels in the 2 GHz to 8 GHz band has been operated with a 56 dB weighted signal-to-noise ratio. Other arrangements using microwave carriers for subscriber loop transmission have put (1) five frequency-modulated video channels in the 150 MHz to 300 MHz band and (2) ten frequency-modulated video channels in a C-band satellite signal in the 4.9 GHz to 5.2 GHz band.

The currently most attractive scheme for multiplexing multiple video channels onto a continuous-wave laser output involves amplitude modulated-vestigial sideband signal multiplexing. Some previously available semiconductor lasers can exhibit distortions approaching the required low levels. However, typically only a small fraction of a given batch of otherwise suitable lasers meet the distortion requirements, requiring extensive noise measurements to identify those lasers that have sufficiently low distortion. Such prior art testing is time-consuming and costly. Thus, it would be highly desirable to have available a method of producing lasers that includes a simple technique for identifying lasers that will have low distortion, such that the thus identified lasers will typically be adapted for use in a multichannel analog optical fiber communication system. This application discloses such a method.

SUMMARY OF THE INVENTION

In a broad aspect the invention is a method of producing a laser adapted for use in a multichannel analog optical fiber communications system. The system comprises transmitting means, receiving means, and a length of optical fiber, signal-transmissively connecting the transmitting means and the receiving means. The transmitting means comprise a semiconductor laser. With the laser is associated a light output intensity (designated L) that is a function of an electrical current (designated I)

through the laser. With the laser is further associated a first derivative and one or more higher order derivatives of L with respect to I (designated L', L", ... respectively).

The operation of the system comprises causing a current of predetermined value to flow through the laser, and varying the current in response to an external signal, such that L varies in response to the external signal. In general the current has a dc component corresponding to the operating point of the diode on the L-I curve, and an ac (typically about 50–500 MHz in frequency) component superimposed on the dc component. The operating point is selected at or near the current value at which L' is substantially a maximum. Operating the laser at the thus determined operating point can result in relatively low signal distortion, in particular, relatively low second order distortion, and makes it possible to meet the very stringent specifications that are deemed necessary for successful operation of multichannel analog fiber CATV trunk transmission systems under current consideration.

More particularly, the invention is a method of producing semiconductor lasers adapted for use in a multi-channel analog transmission system, exemplarily a system of the type currently being considered for CATV signal transmission. The method comprises making a multiplicity of semiconductor lasers, testing the lasers and selecting the laser from the multiplicity in accordance with predetermined criteria. The thus selected laser is then typically packaged and otherwise readied for use, typically in conventional fashion.

The testing of the laser comprises determining, typically for any given laser within the multiplicity, L as a function of I over a range of currents that include the threshold current ($I_{th}$) and $I_{op}$ (the current at which L' is a maximum). It also comprises determining, at least for those devices for which $I_{op}-I_{th}>0$ and for which light output L at $I_{op}$ is greater than a predetermined value (e.g., at least about 1 mW), a parameter that is a predictor of the distortion behavior of the device, if the device were to be used in a multichannel analog system. The parameter is determined from one or more of L, L' and the higher order derivatives of L with respect to I. Exemplarily, the parameter is the (normalized) second harmonic distortion (designated herein 2 HD/C). The method further comprises selecting those devices for which the parameter indicates that the distortion would be below a predetermined limit over a relatively large range of laser injection currents (e.g., at least 2 mA, the range of course containing $I_{op}$). This range in current will be denoted $\Delta I$. Exemplarily, those devices are selected for which (assuming a modulation index of 0.04) 2 HD/C < −70 dbc over $\Delta I \gtrsim 4$ mA. The thus selected lasers generally will have useful light output and relatively low signal distortion, when operated with a dc bias at or near $I_{op}$ in a multichannel analog communication system.

It will be noted that, according to the invention, the lasers can be selected without measurement of actual distortion (or of any other noise) associated with the device. Noise measurements typically are relatively difficult and therefore costly. Thus, the inventive method of making lasers adapted for use in a multichannel analog communication system has substantial advantages over prior art methods which typically require that noise (e.g., distortion) measurements be performed on each device.

As will be appreciated by those skilled in the art, the inventive method may also comprise other tests, carried out before or after the above described measurements. For example, the devices on a given wafer may be subjected, prior to their separation, to a preliminary light emission test to identify non-functioning devices.

DETAILED DESCRIPTION OF SOME CURRENTLY PREFERRED EMBODIMENTS

Figure 1:
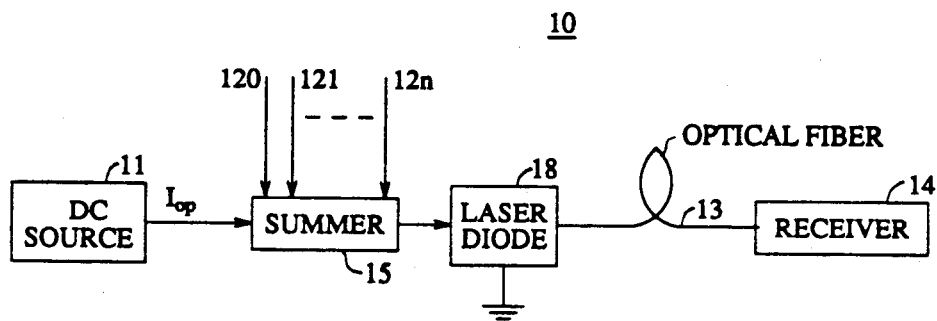
FIG. 1 is a block diagram of an exemplary system according to the invention, namely, a multi-channel sub-carrier multiplexed amplitude modulated optical communication system.

FIG. 1 schematically depicts an exemplary amplitude modulated-vestigial sideband signal sub-channel multiplexed optical transmission system 10. Several baseband frequency modulation television channel signals 120, 121, 122, ... 12n are frequency division multiplexed on different carrier frequencies $\omega_0, \omega_1, \omega_2 \ldots \omega_n$, (with n typically substantially greater than 10, e.g., about 40) as separate amplitude modulated-vestigial sideband signal sub-channels in a composite multiplex signal. A summer 15 combines the individual channel signals at the different sub-channel frequencies and a dc bias current $I_{op}$ from dc source 11 into the composite multiplex signal. This composite multiplex signal is applied to a laser diode 18 as the laser drive input signal.

The total laser input drive signal, or injection current, to the laser diode 18 includes both the dc bias component $I_{op}$ and the composite multiplex signal from the summer 15. The channels typically are equally spaced in frequency, with the frequency width of each channel typically being in the range from 10–550 MHz, the bandwidth typically depending, inter alia, on the nature of the signal that is to be transmitted. The output of the laser generally is in the visible or near infrared portion of the spectrum, exemplarily in the approximate range 0.8–1.6 μm. Currently preferred are wavelengths of about 1.3 and 1.55 μm, corresponding to the transmission "windows" of currently available $SiO_2$-based optical fibers. The output radiation is coupled into optical fiber 13, and transmitted therethrough to receiver 14.

Although the inventive method can be practiced with a variety of semiconductor lasers, the discussion herein will be primarily in terms of a particular and currently preferred type of laser, namely, capped mesa buried heterostructure distributed feedback (CMBH-DFB) lasers. No limitation is thereby implied. Such lasers are known to those skilled in the art. See, for instance, J. Zilko et al., *IEEE Journal of Quantum Electronics*, Vol. 15(10), pages 2091-95, 1989, incorporated herein by reference. Typically, an antireflection coating is applied to the front laser facet, and a relatively high reflectivity coating to the rear facet, to give good slope efficiency and side mode suppression. Such coatings are well known to those skilled in the art.

Figure 2:
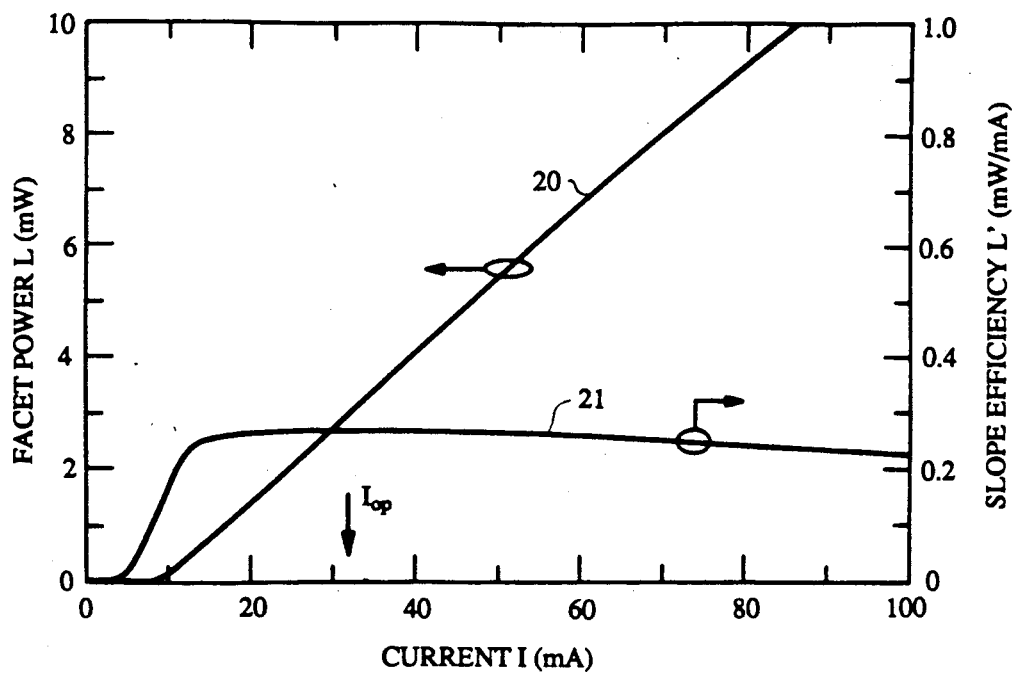
FIG. 2 shows an exemplary curve of light output intensity L versus laser injection current I, and also shows L', the first derivative of L with respect to I.

FIG. 2 shows the light-current (L-I) characteristic 20 of an exemplary CMBH-DFB laser that emits at about 1.3 μm, and also shows the slope efficiency (L') 21 of the exemplary laser. An ideal laser would have a perfectly straight L-I curve and a flat L' above threshold $I_{th}$. The threshold current is defined as the device current at which the transition to laser oscillation occurs. A convenient way to define $I_{th}$ numerically is the following. From the L-I data one identifies the data points $\{I_n, L_n\}$ for which $1 \text{ mW} < L_n < 5 \text{ mW}$. A least-squares-fit of these data points to a quadratic polynomial, i.e., $$L_n = a + bI_n + cI_n^2$$

yields fitting parameters a, b and c. The threshold current $I_{th}$ can then be defined as the current at which the above polynomial extrapolates to $L=0$, i.e., $$0 = a + bI_{th} + cI_{th}^2.$$

As exemplified by FIG. 2, in practical devices the presence of current leakage and other effects decreases L' somewhat at higher currents, resulting in the presence of a maximum in L'. The location of the maximum can be determined directly from L' or, more typically, from L''. $I_{op}$ is the current at which L' is a maximum or, equivalently, the current at which $L''=0$. $I_{op}$ is indicated in FIG. 2, occurring in this exemplary case at about 32 mA. As those skilled in the art know, it is a simple matter to determine L' and L'' by known electronic means or by means of a digital computer.

In electronic amplifiers second order distortion usually can be practically eliminated. In contrast thereto, in lasers in general both second and third order distortion can be performance limiting. It has recently been found that the second order distortion of a laser can be approximately calculated from the L-I curve of the laser. As a simple example of this calculation, consider modulation by a single carrier with modulation index m:

$$I(t) = I_b + m(I_b - I_{th}) \cos(\omega t),$$

wherein I(t) is the laser current, $I_b$ is the dc bias current, and ω is the angular frequency of the ac component of the laser current.

An expansion about $I_b$ gives the (normalized) second harmonic distortion at the frequency 2ω, designated herein 2 HD/C.

$$2 HD/C = 20 \log(mL''L/4 L'^2),$$

where L, L' and L'' have the values appropriate for any given $I_b$. This expression suggests that the second order distortion vanishes where $L''=0$. In practice, it has been found that for bias currents at or near the value corresponding to $L''=0$ the distortion performance of many semiconductor lasers is significantly better than it is for other values of the dc bias.

Figure 3:
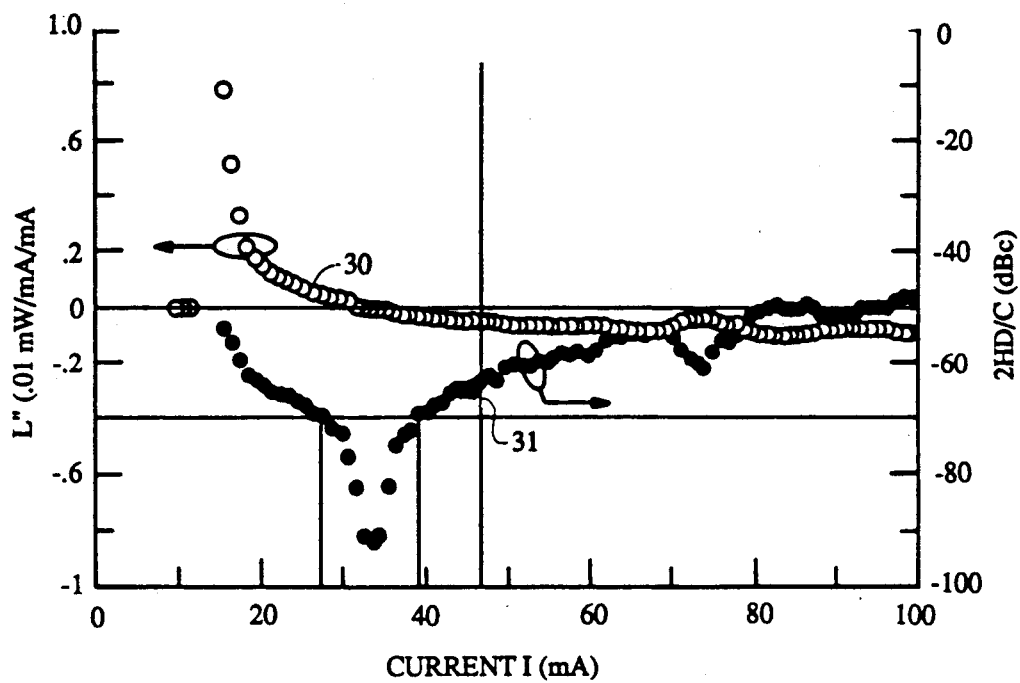
FIG. 3 shows L" and the normalized second harmonic distortion (2 HD/C) for the exemplary device of FIG. 2.

Curve 30 of FIG. 3 shows L'' versus I for the device of FIG. 2, and curve 31 shows the value of 2 HD/C for the same device, assuming that $m=0.04$. As can be seen from FIG. 3, the value of 2 HD/C of the exemplary device shows a pronounced minimum at about 32 mA, being less than −70 dbc over the approximate current range 27-39 mA.

Figure 4:
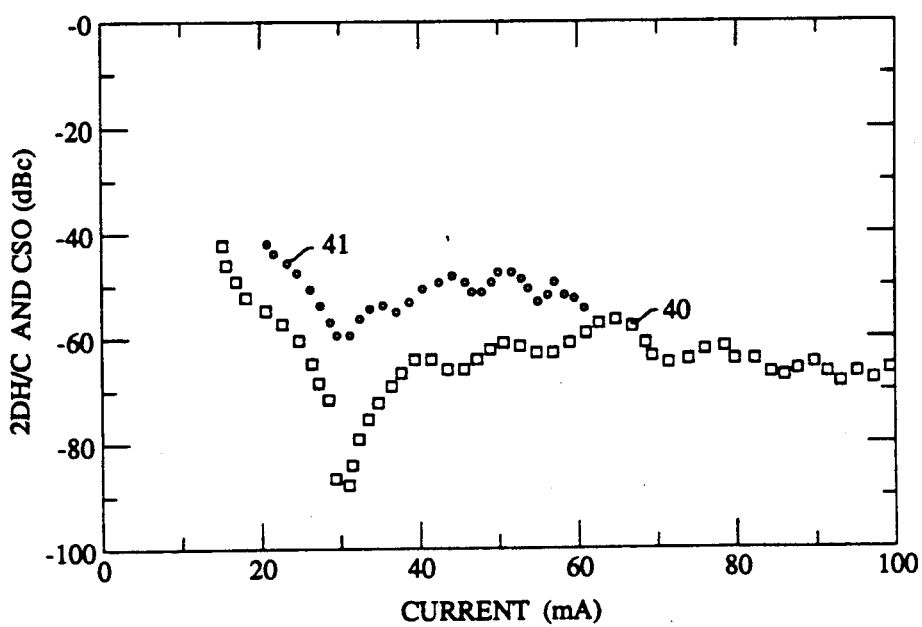
FIG. 4 shows an exemplary curve of the "composite second order-to-carrier" ratio (CSO) and of 2 HD/C, both for an exemplary laser similar to that of FIGS. 2 and 3.

FIG. 4 shows, for a laser similar to that of FIGS. 2 and 3, 2 HD/C (curve 40) and the measured value of the composite second order (CSO) distortion (curve 41) in channel 3 of a 42 channel analog transmission system that used the laser. At FIG. 4 demonstrates, there was observed a significant decrease in CSO for currents at or close to the minimum in 2 HD/C. As discussed above, the minimum in 2 HD/C occurs at $I_{op}$. A minor amount of fine tuning of the injection current may be required to obtain optimum system performance, although operation exactly at $I_{op}$ in many cases will result in acceptable performance.

FIG. 2 exemplifies "soft" turn-on, a characteristic highly desirable for lasers that are to be used in analog systems of the type discussed herein. By "soft" turn-on we mean herein that $I_{op}$ is significantly greater than (typically by at least about 5 mA) $I_{th}$, and that the absolute value of the slope of L'' at $I_{op}$ is relatively small (exemplarily $\lesssim 5 \times 10^{-5} \text{ mW/mA}^3$). Some lasers exhibit "abrupt" turn-on, by which we man that the maximum of L' typically occurs at a value of I significantly smaller than for soft turn-on, sometime even smaller than $I_{th}$, and wherein the absolute value of the slope of L'' at $I_{op}$ is relatively large (exemplarily greater than $1 \times 10^{-4} \text{ mW/mA}^3$). Lasers exhibiting abrupt turn-on frequently are not as well suited for use in an analog communication system as are those which exhibit soft turn-on because, inter alia, at $I_{op}$ the light output of the former may be too small to be acceptable. However, lasers with abrupt turn-on are not necessarily unsuitable for use in analog systems, depending on both the system specifications and the details of the laser performance.

We have observed that many Fabry-Perot semiconductor lasers have abrupt turn-on. On the other hand, many DFB lasers have soft turn-on, with significant (exemplarily as high as 10 mW or even higher) facet power (L) at $I_{op}$. Thus, DFB lasers are currently preferred for use in analog systems of the type described above.

The specifications for lasers that are to be used in multichannel analog systems of the type discussed herein are so demanding that current laser fabrication technology typically can not assure that all (or even a majority of) devices on a given wafer meet specifications. Thus, testing of devices is necessary, such that suitable ones can be identified. To measure actual distortion performance (e.g., CSO) is difficult and time consuming, and consequently costly. On the other hand, L, L' and higher derivatives can be easily and quickly measured. Applying the discovery that the maximum in L' typically occurs at substantially the same current as the minimum in CSO to producing lasers for use in multichannel analog systems, one selects from a multiplicity of previously produced lasers those that meet certain criteria regarding their curve of light output versus injection current. This curve can be determined by conventional means. The lasers can also be produced by conventional means.

According to the invention, L, L' and L'' are determined as a function of the injection current, for a current range that includes $I_{th}$ and $I_{op}$, and devices for which $I_{op} - I_{th} > 0$ (preferably $>5$ mA) and L at $I_{op}$ is greater than some predetermined value (e.g., $>1$ mW, preferably at least 3 mW) are identified. For at least the thus identified devices a parameter that is predictive of the signal distortion behavior of the device is determined from one or more of the previously determined L, L' and higher derivatives. In currently preferred embodiments the parameter is 2 HD/C.

The inventive method further comprises identifying from the set of previously identified devices a laser (or lasers) for which the value of the parameter indicates that the device will have signal distortion (e.g., CSO) below a predetermined value over a relatively wide range of injection currents. In currently preferred embodiments those devices are identified for which 2 HD/C is below a predetermined value, e.g., no more than −70 dbc over a current range of at least 4 mA. Thus selected devices generally perform well in multichannel analog systems of the type described herein.

As will be recognized by those skilled in the art, practice of the inventive method can substantially reduce the time and expense of selecting lasers suitable for use in multichannel analog communication systems, and thus can significantly reduce the cost of producing such systems.

EXAMPLE

On an InP wafer a multiplicity of CMBH DFB lasers were produced by conventional means. The lasers were designed to emit radiation with 1.3 μm wavelength. Prior to bonding of the laser chips, the lasers were tested, and those that failed to lase were identified.

Several of the previously passed lasers were further tested. Testing of a given one of the lasers entailed mounting the chip on an appropriately metallized BeO carrier that in turn was attached to a copper stud that was cooled by conventional thermoelectric cooling means, whereby the device was maintained at about 20° C. It further entailed exciting the laser with current pulses (800 ns duration, 0.1% duty cycle) produced by a pulse power supply (HP 8160A). The resulting light pulses were detected by means of a Ge photodetector in conventional fashion, and the resulting electrical signal analyzed by an SR 250 signal averager. The light and current data were recorded by a conventional computer (HP 310), programmed to produce the L versus I plot for the device, as well as to produce plots of L' versus I, L'' versus I, and 2 HD/C versus I. The computer programs were conventional. The computer produced all of these plots, which are shown in FIGS. 2 and 3. From the plots we determined $I_{op}$, $I_{th}$, and the current range for which 2 HD/C ≦ −70 dbc. Review of these parameters indicated that the given device is suitable for use in a 42 channel analog optical fiber CATV system.

As those skilled in the art will readily appreciate, the L versus I characteristics do not need to be determined by a pulse method, although heating effects can typically be minimzed thereby. These characteristics can also be determined by, e.g., a dc method, or by means of a method that uses a dc source together with ac single or multi-channel modulation.

We claim:

1. Method of producing a semiconductor laser adapted for use in a multichannel analog optical fiber communication system, the method comprising
   a) making a multiplicity of semiconductor lasers, associated with each laser being a light output (L) as a function of an injection current (I), a first derivative (L') and higher order derivatives (L'', L''', ...) of L with respect to I;
   b) testing the multiplicity of lasers, and selecting the laser from the multiplicity of lasers in accordance with predetermined criteria; and
   c) performing one or more further steps towards completion of the laser;
   characterized in that step b) comprises
      i) determining, for a given laser, from one or more of L, L' and the higher order derivatives, a parameter that is predictive of a distortion behavior of the device in the multichannel analog system; and
      ii) selecting the given laser for use in the transmission system if the value of the parameter is better than a predetermined value over a relatively large range of I, with $I_{op}$ being within the range, $I_{op}$ being the current at which L' is a maximum.

2. Method of claim 1, wherein the parameter is the normalized second order distortion (2 HD/C), where 2 HD/C is a function of L' and L'' of the laser, wherein the laser is selected if 2 HD/C is less than a predetermined value over a range of at least 2 mA, and wherein $I_{op} - I_{th} > 5$ mA, where $I_{th}$ is the threshold current of the laser.

3. Method of claim 2, wherein the laser is selected if 2 HD/C ≲ −70 dbc over a range of at least about 4 mA, and wherein the laser has L of at least about 3 mW at $I_{op}$.

4. Method of claim 1, wherein the laser is a distributed feedback laser.

5. Method of claim 1, wherein b) comprises applying a pulsed current to the given laser.

6. Method of claim 1, wherein b) comprises applying an ac-modulated dc current to the given laser.

* * * * *